(12) United States Patent
Hoffmeister

(10) Patent No.: US 9,438,183 B2
(45) Date of Patent: Sep. 6, 2016

(54) AMPLIFIER DEVICE AND METHOD FOR ACTIVATING AN AMPLIFIER DEVICE OR THE AMPLIFIER UNIT

(71) Applicant: Robert Bosch GmbH, Stuttgart (DE)

(72) Inventor: Fabian Hoffmeister, Schoenau (DE)

(73) Assignee: Robert Bosch GmbH, Stuttgart (DE)

( * ) Notice: Subject to any disclaimer, the term of this patent is extended or adjusted under 35 U.S.C. 154(b) by 47 days.

(21) Appl. No.: 14/371,885

(22) PCT Filed: Jan. 14, 2013

(86) PCT No.: PCT/EP2013/050559
§ 371 (c)(1),
(2) Date: Jul. 11, 2014

(87) PCT Pub. No.: WO2013/107708
PCT Pub. Date: Jul. 25, 2013

(65) Prior Publication Data
US 2014/0361831 A1    Dec. 11, 2014

(30) Foreign Application Priority Data

Jan. 16, 2012  (DE) ......................... 10 2012 200 524

(51) Int. Cl.
| | |
|---|---|
| *H03F 1/14* | (2006.01) |
| *H03F 3/185* | (2006.01) |
| *H03F 1/30* | (2006.01) |
| *H03F 3/217* | (2006.01) |

(52) U.S. Cl.
CPC .............. *H03F 3/185* (2013.01); *H03F 1/305* (2013.01); *H03F 3/2171* (2013.01); *H03F 3/2178* (2013.01); *H03F 2200/03* (2013.01); *H03F 2203/21157* (2013.01); *H03F 2203/21178* (2013.01)

(58) Field of Classification Search
CPC .......... H03F 3/217; H03F 1/14; H03F 1/305; H03F 3/185; H03F 3/2171; H03F 3/2178; H03F 2200/03; H03F 2203/21157; H03F 2203/21178; H03G 3/3026

USPC ............ 330/51, 124 R; 348/14–17; 381/120, 381/94.5; 455/556; 704/219, 222, 230
See application file for complete search history.

(56) References Cited

U.S. PATENT DOCUMENTS

| | | | |
|---|---|---|---|
| 4,860,359 A * | 8/1989 | Eicher ...................... | H04B 1/46 455/79 |
| 5,953,049 A | 9/1999 | Horn et al. | |

(Continued)

FOREIGN PATENT DOCUMENTS

| | | | | |
|---|---|---|---|---|
| EP | 1659569 | 5/2006 | | |
| WO | WO 2011049997 A1 * | 4/2011 | ........... | H03F 1/0222 |

OTHER PUBLICATIONS
International Search Report for Application No. PCT/EP2013/050559 dated May 3, 2013 (English Translation, 3 pages).

*Primary Examiner* — Steven J Mottola
*Assistant Examiner* — Hafizur Rahman
(74) *Attorney, Agent, or Firm* — Michael Best & Friedrich LLP

(57) ABSTRACT

Known types of amplifiers include so-called class D amplifiers, which first use a pulse-width modulator to convert an analog signal into a pulse-width modulated switching signal, which is then amplified and subsequently converted back into a continuously variable voltage via a filter. This type of amplifier is particularly energy-efficient and is therefore preferably used for high-power amplifiers. The invention relates to an amplifier device 1 comprising a control device (5), wherein the control device (5) has an input interface for an audio signal (2), and comprising an amplifier unit (9) for amplifying the audio signal (2, 8) downstream of the control device (5), wherein the control device (5) has a delay module (6) that is designed to transmit the audio signal (2), delayed by a delay value delta_t, to the amplifier unit (9) and to automatically and/or autonomously reduce the delay value delta_t from a starting value delta_t to a final value during an adaptation phase AP.

13 Claims, 3 Drawing Sheets

(56) References Cited

U.S. PATENT DOCUMENTS

| | | |
|---|---|---|
| 6,931,373 B1 | 8/2005 | Bhaskar et al. |
| 2005/0019020 A1 | 1/2005 | Sato et al. |
| 2006/0012710 A1 | 1/2006 | Sasaki |
| 2006/0111903 A1* | 5/2006 | Kemmochi .......... G10H 1/0091 704/244 |
| 2006/0284673 A1 | 12/2006 | Peruzzi et al. |
| 2006/0290810 A1 | 12/2006 | Mallinson |
| 2011/0128075 A1 | 6/2011 | Maier et al. |

* cited by examiner

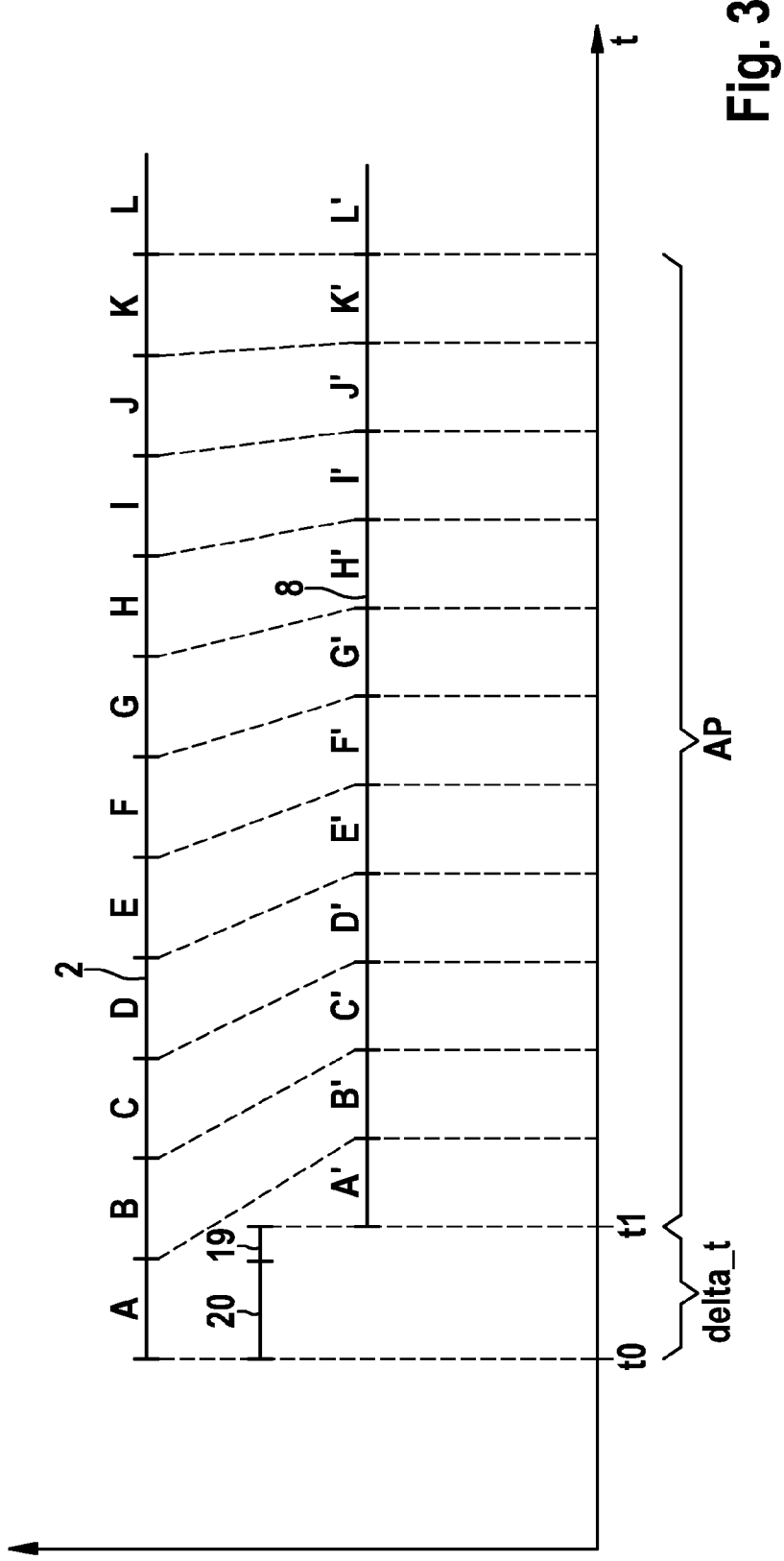

AMPLIFIER DEVICE AND METHOD FOR ACTIVATING AN AMPLIFIER DEVICE OR THE AMPLIFIER UNIT

BACKGROUND OF THE INVENTION

The invention relates to an amplifier device comprising a control device, wherein the control device has an input interface for an audio signal, and comprising an amplifier unit for amplifying the audio signal downstream of the control device.

Amplification systems are used in many areas. Said systems are, for example, used in small-scale equipment, such as, for example, cellular phones or smartphones, in mid-scale equipment, such as, for example, home music systems or televisions, or also in large-scale equipment, such as, for example, public address systems or PA systems.

Known types of amplifiers include so-called class D amplifiers, which first use a pulse-width modulator to convert an analogue signal into a pulse-width modulated switching signal, which is then amplified and subsequently converted back into a continuously variable voltage via a filter. This type of amplifier is particularly energy-efficient and is therefore preferably used for high-power amplifiers.

The German patent publication DE 102008040291 A1, which arguably constitutes the closest prior art, discloses such a class D amplifier.

SUMMARY OF THE INVENTION

An amplifier device having the features of embodiments of the invention, a method for activating an amplifier device or the amplifier unit having the features of embodiments of the invention and a control device having the features of embodiments of the invention are disclosed. Preferred or advantageous embodiments of the invention ensue from the claims, the description below as well as from the attached drawings.

The invention relates to an amplifier device which is designed to amplify an audio signal. The amplifier device can, for example, be used in sound systems or—preferably—in public address systems, in particular in PA systems for the acoustic irradiation of complex areas. For example, the amplifier device can be used for the acoustic irradiation of a soccer stadium, a theater, a school etc. The audio signal is, for example, configured as an analogue signal which originates from a microphone or another audio source.

The amplifier device comprises a control device, wherein the control device has an input interface for an audio signal. The audio signal is therefore introduced via the control device into the amplifier device. The control device can be provided as a compact or central component or in modified embodiments—also, e.g., divided into functions—can be distributed in a decentralized manner in the amplifier device.

An amplifier unit, which is designed to amplify the audio signal, is connected downstream of the control device.

Within the scope of the invention, it is proposed that the control device has a delay module that is designed to transmit the audio signal, delayed by a delay value, to the amplifier unit and to automatically and/or autonomously reduce the delay value from a starting value to a final value during an adaptation phase.

The delay module therefore serves to temporally delay the audio signal by the delay value, in particular to cache said audio signal, and to transmit said audio signal to the amplifier unit only after the delay value has expired. The delay value is reduced or degraded from a starting value to a final value by the delay module.

It is an advantage of the invention that on the one hand a delay of the audio signal is facilitated by the delay module and on the other hand a possibility is created to again reduce this delay during an adaptation phase or even to reduce said delay to a final value of zero. It is thereby worth considering that it may be necessary for reasons of circuit design not to transmit an audio signal immediately or without delay to the amplifier unit, but only after a delay. For example, the audio signal can once again be checked during this delay phase as to whether said signal should actually be transmitted. A further, preferred alternative for an application is described below.

A permanent signal delay is however in many areas of application not desirable or even to absolutely be avoided. If, for example, a plurality of amplifier devices is used, different delay values particularly lead to phase errors in the outgoing audio signals which are unpleasant for the listener. Furthermore, a permanent signal delay in one individual amplifier device can also be perceived by listeners to be unpleasant because the optical image of an actor does not coincide with the audio transmission of his/her voice. In addition, irritations which are caused by the actors or artists themselves and are amplified over the amplifier device are particularly critical if these delays have to be put up with during speech or singing.

The inventive embodiment of the amplifier device ensures that a temporary signal delay is in fact initially allowed, said delay is however reduced immediately or without delay so that the disruptions resulting from the delay value are minimized.

A particularly preferred embodiment of the invention relates to an activation of the amplifier device. Such an activation occurs, e.g., during a basic power-on of the amplifier unit or when activating the amplifier device from a power-saving state, in particular from a standby mode and/or from a hibernation mode.

In this preferred application, the control device comprises a switch-on module for activating the amplifier unit and simultaneously the delay module. The switch-on module is triggered by an incoming audio signal at the input interface and is designed to activate the amplifier device and the delay module, in particular in synchronization with each other, in response to the audio signal being received at the input interface. The switch-on module and the delay module are designed such that a starting value for the delay value for the temporal delay of the audio signal is selected to be longer than the duration of the activation process of the amplifier unit; thus enabling the delayed audio signal to first reach the amplifier unit after the activation process has been completed, i.e. in an amplification-ready state.

In a particularly preferred manner, the incoming audio signal is initially cached by the delay module. At the same time, the amplifier unit is activated by the switch-on module. As soon as the amplifier unit has passed through the activation process and is activated, the audio signal is released and is delivered as a delayed audio signal to the amplifier unit. The temporal delay between the arrival of the audio signal and the delivery of the delayed audio signal to the amplifier unit corresponds to the starting value for the delay value.

The advantage of the interaction between switch-on module and delay module is that—for the case that the amplifier unit has been switched to inactive—the audio signal is initially cached until the amplifier unit is again activated and is only then transmitted to said amplifier unit. This embodiment ensures that a loss of information cannot occur because the delayed audio signal is only transferred to the operationally ready amplifier unit. The signal delay described above does however result from this embodiment.

Said signal delay is reduced automatically and/or autonomously by the delay module during the adaptation phase which preferably directly follows the activation process.

In an embodiment of the invention which is preferred in terms of circuit technology, the starting value is designed less than 80 milliseconds, preferably less than 60 milliseconds and in particular less than 40 milliseconds. This delay value is sufficient to bridge the length of time required for the activation of the amplifier unit.

It is particularly preferred for the final value to be less than 50 percent, preferably less than 30 percent and in particular less than 10 percent of the starting value or in particular to be zero seconds. The consideration underlying these specifications is that the delay value should be minimized in the adaptation phase. It can however be technically argued for the delay value not to be reduced to zero seconds but to still be a small fraction of the starting value.

In a preferred embodiment of the invention, the time duration for the adaptation phase for transforming the delay value from the starting value into the final value is dimensioned greater than a second, preferably greater than five seconds and in particular greater than eight seconds. As an alternative or in addition thereto, said time duration lasts less than 40 seconds, preferably less than 30 seconds and in particular less than 20 seconds. The ratio between the time duration of the adaptation phase and the delay value is dimensioned such that the reduction of the delay value occurs slowly to the extent that the frequency increase in the audio signal cannot, can hardly or can be undisturbingly perceived by the human ear. The aforementioned values of the delay value and the adaptation phase fulfill these requirements. If, for example, a delay value of 20 milliseconds is taken as a basis, the time for achieving the direct or undelayed signal transmission should lie between five and ten seconds.

In a particularly preferred and technically advantageous embodiment, provision is made for the amplifier unit to comprise a class D amplifier or to be designed as such an amplifier. As already mentioned at the beginning of the application, class D amplifiers are especially energy efficient if they are used to amplify audio signals. For this reason, class D amplifiers are also preferably used in high-power applications.

Class D amplifiers do, however, require a large amount of electrical energy, which is substantially converted into heat due to switching losses in the amplifier unit or in the output filter, in the standby mode—i.e. switched on and without an audio signal being present. If it is assumed that, when using the amplifier device for the acoustic irradiation of a soccer stadium, the amplifier device is used on a long-term basis only for approximately five percent of the time, the absorbed energy is wasted during 95 percent of the operating time.

In order to minimize these standby losses, provision is made for the amplifier device, in particular the amplifier unit, to be switched into the energy saving mode after a certain amount of time without a signal being applied, e.g. 15 minutes. The arousal of the amplifier device or, respectively, the amplifier unit out of the energy saving mode requires however a certain time period for the activation process, so that it hasn't been justifiable until now to shift the amplifier device or amplifier unit into the energy saving mode during operation. It is now possible with the invention to send the amplifier device or unit into the energy saving mode and—in the event of an audio signal being applied—to reactivate said device or unit, wherein the time duration for the activation process is compensated by the delay module in that the audio signal is initially cached and thus outputted, delayed by a temporal delay value, and subsequently reduced in the adaptation phase of the delay value.

In a particularly preferred structural embodiment of the invention, the class D amplifier comprises a pulse-width modulator and a downstream power element, wherein, upon deactivating the amplifier unit for the energy saving mode, pulse-width modulated signals from the pulse-width modulator are separated from the downstream power element in order to prevent power losses.

In a preferred modification to the invention, a switching means is disposed downstream of the output of the class D amplifier, said switching means being designed to separate the output of the amplifier unit from a downstream loud speaker or loud speaker system so that, during a separation, no noise interferences are transmitted from the amplifier unit to the downstream loud speaker during the activation process.

When shifting the amplifier unit into the energy saving mode, the output of the amplifier unit is initially separated from the downstream loudspeaker via, e.g., a relay used as a switching means. Subsequently to this action, the deactivation of the class D amplifier takes place by blocking the pulse-width modulated signals.

When the amplifier unit is activated, the class D amplifier is reactivated by unblocking the pulse-width modulated signals after the application of an audio signal; thus enabling the power element to begin switching again. As soon as the class D amplifier has again settled, the output of the class D amplifier is also again connected by means of the relay used as a switching means. This delayed switching-in is advantageous in order to prevent a "crackling" of the loudspeaker that is caused by the settling of the class D amplifier.

In a preferred implementation of the invention, the control device is designed as a DSP (digital signal processor) or comprises the same, wherein the DSP is designed to cache the audio signal during the delay. The storage can, for example, take place in a FIFO structure.

A further subject matter of the invention relates to a method for activating an amplifier device, in particular the amplifier device as said device was previously described, respectively according to one of the preceding claims, wherein the amplifier device is initially located in an energy saving mode and is activated out of the energy saving mode by means of an incoming audio signal. The audio signal is delayed by a delay value during an activation process of the amplifier device, wherein, after the activation process, the delayed audio signal is amplified with a starting value as the delayed value and wherein the delay value is reduced from the starting value to a smaller final value or to zero in an adaptation phase in order to amplify the audio signal in an undelayed manner after the adaptation phase.

BRIEF DESCRIPTION OF THE DRAWINGS

Further features, advantages and effects of the invention ensue from the following description, preferred exemplary embodiments of the invention as well as from the attached drawings. In the drawings:

FIG. 3 shows a diagram to illustrate the method according to a possible embodiment of the invention.

DETAILED DESCRIPTION

Figure 1:
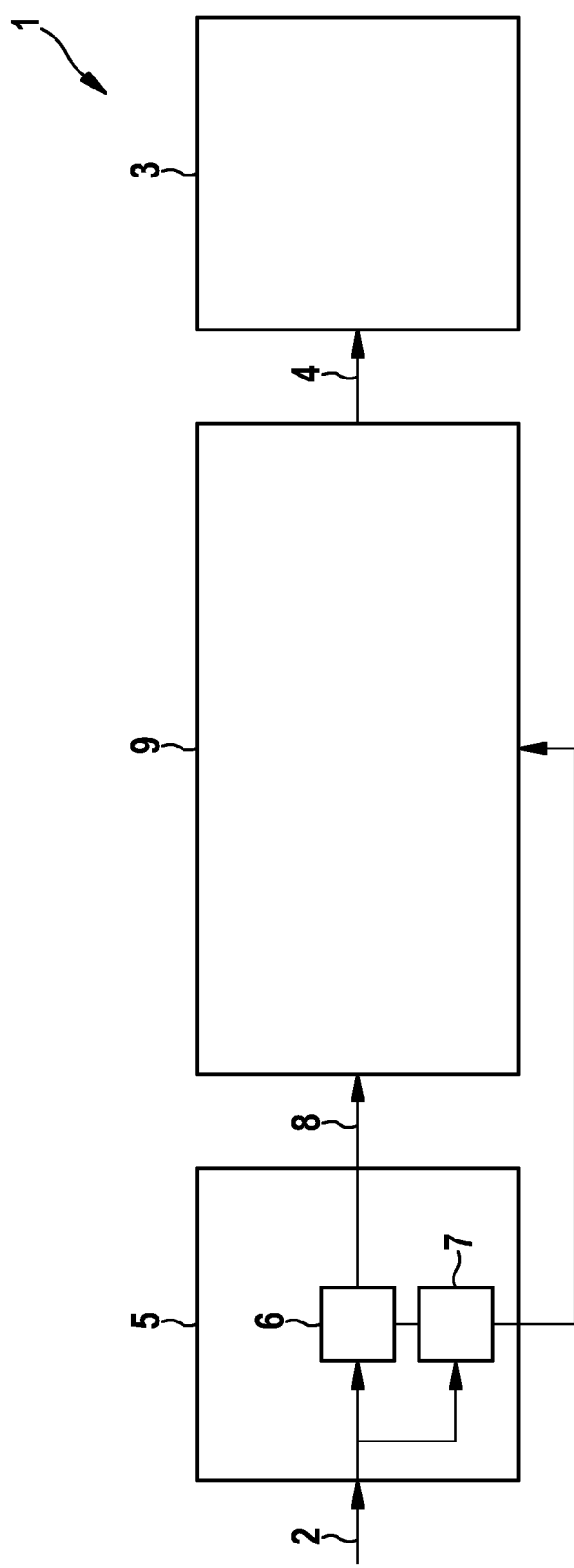
FIG. 1 shows a schematic block diagram of an amplifier device as an exemplary embodiment of the invention.

FIG. 1 shows in a highly schematized manner in a block diagram an amplifier device 1 as an exemplary embodiment of the invention. The amplifier device 1 is designed to amplify an incoming audio signal 2 and to output the same to one or a plurality of loud speakers 3 as an outgoing audio signal 4.

The incoming audio signal 2 can, for example, come from a microphone or another audio source. It is particularly preferred for the incoming audio signal 2 to be a speech signal or a vocal message. The amplifier device 1 is designed, for example, for the acoustic irradiation of a large area, such as, for example, a soccer stadium. The power output of the amplifier device 1 is, e.g., greater than 100 watts, especially greater than 500 watts and in particular greater than 1000 watts.

The amplifier device 1 comprises a control device 5 which includes a delay module 6 and a switch-on module 7. The delay module 6 is designed to convert the incoming audio signal 2 into a temporally delayed audio signal 8 which goes out from the control device 5 and is delivered to a downstream amplifier unit 9.

The switch-on module 7 is designed to control the delay module 6 and the downstream amplifier unit 9. An activation of the amplifier unit 9 occurs, for example, if the amplifier device 1 and in particular the amplifier unit 9 is switched into an energy saving mode. The switching into an energy saving mode can, for example, occur if the amplifier device 1 or the amplifier unit 9 is not activated for a predeterminable time period, i.e. the incoming audio signal 2 lies below a limit value for the predeterminable time period.

By means of the energy saving mode, energy can be significantly saved during operation of the amplifier device 1. Hence, there are many applications in which the amplifier device 1 is not used for the majority of the operating time. If, for example, a closer look is taken of a typical soccer game, the amplifier device 1 is used for the acoustic irradiation of the stadium typically for less than five percent of the entire time on the day of the soccer game so that the amplifier device 1 can theoretically be switched into the energy saving mode for 95 percent of the operating time. It is thus, e.g., conceivable for the amplifier device 1 to be "started up" and tested already on the morning of the soccer game, although said device is first to be used in the evening for the acoustic irradiation of the game. It is also possible that the amplifier device remains activated every day, i.e. 365 days of the year, although said device is needed, e.g., only every third day for 5 hours.

From a technical standpoint, the amplifier device 1 or, respectively, the amplifier unit 9 requires however a certain time period during an activation process for shifting from the energy saving mode to the operating mode, in order, for example, to carry out settling processes during the activation. It is therefore not practical to transmit an incoming audio signal 2 without delay to the amplifier unit 9 if the amplifier device 1 is in an energy saving mode. Because the amplifier unit 9 is not yet ready for amplification, a beginning section of the incoming audio signal 2 would not be amplified so that a loss of information would occur.

In order to prevent this effect, the control device 5 is designed to activate the amplifier unit 9 via the switch-on module 7 when an incoming audio signal 2 arrives; thus enabling said amplifier unit to be shifted from the energy saving mode into an operating mode. In order to avoid the loss of information at the beginning of the audio signal, the incoming audio signal 2 is delayed by a delay value by means of the delay module 6; thus enabling the delayed audio signal 8 to first arrive at the amplifier unit 9 when said unit is situated in the operating state.

Since, however, such a delay also brings disadvantages with it, provision is made for the delay module 6 to transfer the delay from an initial starting value automatically and/or autonomously to a final value during an adaptation phase and in so doing to reduce said delay. If, for example, the starting value for the delay value is 20 milliseconds, said starting value is reduced to a final value of, e.g., 0 milliseconds during an adaptation phase lasting five to ten seconds.

The slow reduction of the delay value represents a compromise between the disadvantages which result from the delay and any frequency increases which result from the reduction of the delay value. In order to compensate for the delay, the incoming audio signal 2 must therefore be outputted in the adaptation phase faster than the delayed audio signal 8 in real time to the amplifier unit 9, which leads to an increase in frequency in the delayed audio signal 9. The reduction of the delay value is therefore figuratively comparable to playing a record too fast, wherein increases in frequency likewise occur. The selected variables represent a technically practical compromise.

Figure 2:
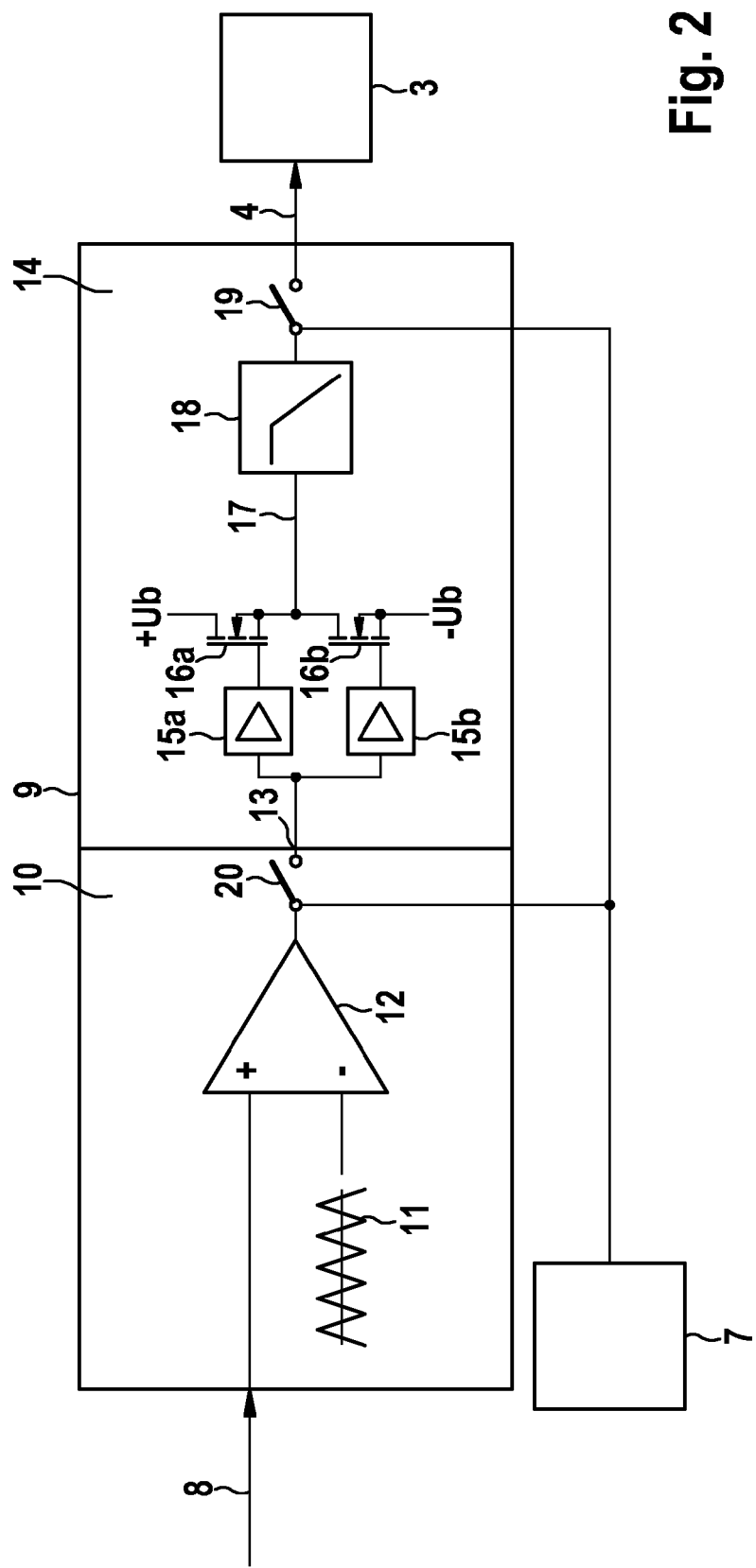
FIG. 2 shows the amplifier unit in FIG. 1 in a possible embodiment.

FIG. 2 likewise shows the amplifier unit 9 in a block diagram, wherein it can be seen that the amplifier unit 9 is designed as a so-called class D amplifier. The input of the amplifier device 9 is depicted on the left-hand side, into which the delayed audio signal 8 enters. The delayed audio signal 8 is initially fed to a pulse-width modulator 10, which in this exemplary embodiment combines the delayed audio signal 8 with a sawtooth signal 11 in a comparator 12 which outputs an unamplified, pulse-width modulated signal 13.

The unamplified, pulse-width modulated signal 13 is guided into a power stage 14 which is designed as a half-bridge, wherein the unamplified, pulse-width modulated signal is split into two branches and initially directed into drivers 15a, b. Said drivers generate gate signals for MOSFETs 16a, b, which generate respectively an amplified signal. The amplified signals are again combined so that an amplified, pulse-width modulated signal 17 is present at the output of the power stage 14. This signal is subsequently passed through a low-pass filter 18; thus enabling the outgoing audio signal to be present as an amplified audio signal. Such a set-up is sufficiently well known as a class D amplifier.

In order to shift the amplifier unit 9 into the energy saving mode, said amplifier unit comprises a switching means 19, which separates the outgoing audio signal 4 from the downstream loud speaker 3, as well as a signaling device 20, which is likewise designed as a switch and which separates the unamplified, pulse-width modulated signal 13 from the power stage 14. The signaling device 20 can also be designed in particular as an AND gate having the same function.

The switching means 19 and the signaling device are operated by means of the switch-on module 7 in order to transfer the amplifier unit 9 from the energy saving state into the operating state.

In the energy saving mode, the switching means 19 as well as the signaling device 20 are open. The open signaling device 19 has the technical effect that the unamplified, pulse-width modulated signal 13 is not transmitted to the power stage 14 so that said power stage does not have to expend any energy for amplification.

If the amplifier unit 9 is transferred from the energy saving mode into the operating mode, the signaling device 20 is then initially closed; thus enabling the unamplified, pulse-width modulated signal 13 to be transmitted to the power stage 14. This requires a certain amount of time for settling processes. As soon as a signal level of 0 volts has settled in downstream of the low-pass filter (without a delayed audio signal 8 being present), the switching means 19 is closed so that the connection to the loud speaker 3 is established. The switching means 19 has the advantage that any noise interferences arising when the power stage 14 is settling are not transmitted to the loud speaker 3. After closing the switching means 19, the amplifier device 9 is in the operating mode and can then amplify the incoming, delayed audio signal 8.

FIG. 3 shows in a highly schematized manner a time diagram for illustrating the method according to the invention, how said method is implemented with the amplifier device 1.

The amplifier device 1, in particular the amplifier unit 9, is initially situated in the energy saving mode up until the point in time t0. At the point in time t0, the incoming audio signal 2 is applied to the input of the control device 5. The incoming audio signal 2 is divided into sections A . . . L along the time axis t and represents an audio signal which, for example, is configured as a voice announcement that reads out these letters.

At the same time as the input of the incoming audio signal 2, i.e. at the point in time t0, the amplifier unit 9 is transferred by means of the switch-on module 7 from the energy saving mode into the operating mode. To this end, the signaling device 20 is initially closed and subsequently the switching means 19 is likewise closed. At a point in time t1, the amplifier unit 9 is in the operating mode. The temporal difference delta_t between t0 and t1 corresponds to the time for the activation process of the amplifier unit 9 and is, for example, 20 ms.

At the same time, the delay module 6 delays the incoming audio signal 2 so that the delayed audio signal 8 is delayed by at least or exactly the delay value delta_t. The value delta_t constitutes a starting value for the delay value. Due to the delay, the delayed audio signal 8 is—as previously described—amplified by the amplifier unit 9 free of any information loss.

In order to reduce the delay value delta_t from the starting value to a final value, in particular to zero, the delay value delta_t is continuously reduced during an adaptation phase AP of, e.g., 5 s to 10 s. The adaptation phase AP immediately follows the activation process at the point in time t1. While a delay value which corresponds to the starting value delta_t prevails between the audio signal sections A and A', the delay value has, for example, already fallen to 50 percent of the starting value at the audio sections G and G'. At the audio section L-L', the delay value has been reduced to the final value, in this case to zero seconds. After the adaptation phase AP, the incoming audio signal 2 is therefore transmitted without delay or distortion to the amplifier unit 9. The amplifier device 1 is then operating in the normal operating mode.

The invention claimed is:

1. An amplifier comprising:
    an amplifier unit, and
    a control device including an input interface for an audio signal, a delay module designed to transmit the audio signal, delayed by a delay value, to the amplifier unit and to reduce the delay value from a starting value to a final value during an adaptation phase, and a switch-on module for activating the amplifier unit and the delay module in response to an incoming audio signal at the input interface when the amplifier unit is in an energy saving mode,
    wherein the starting value for the delay of the audio signal is selected to be equally long as or longer than the duration of an activation process of the amplifier unit so that the delayed audio signal is provided to the amplifier unit after the amplifier unit is activated and capable of providing an output.

2. The amplifier according to claim 1, wherein the starting value is selected to be less than 80 ms.

3. The amplifier according to claim 1, wherein the final value is less than 50% of the starting value or is 0 s.

4. The amplifier according to claim 1, wherein the transformation of the delay value from the starting value to the final value takes place in the adaptation phase for a period of time greater than 1 s and for a period of time less than 40 s.

5. The amplifier according to claim 1, wherein the amplifier unit comprises a class D amplifier.

6. The amplifier according to claim 5, wherein the class D amplifier can be switched to an energy saving mode.

7. The amplifier according to claim 5, wherein a switch is disposed downstream of the output of the class D amplifier, said switch being designed to separate the output of the class D amplifier from a downstream loud speaker in the energy saving mode, so that no noise interferences are transmitted from the class D amplifier to the loud speaker during the activation process.

8. The amplifier according to claim 1, wherein the control device includes a digital signal processor (DSP) that is designed to cache the audio signal during the delay.

9. A method for activating an amplifier, the method comprising:
    activating the amplifier from an energy saving mode in response to an incoming audio signal,
    delaying the audio signal by a delay value during an activation process of the amplifier,
    amplifying the delayed audio signal with a starting value as the delay value after the activation process, and
    reducing the delay value from a starting value to a smaller value and eventually to zero during an adaptation phase so that the audio signal is amplified in an undelayed manner after the adaptation phase.

10. A control device, comprising:
    an input interface for an audio signal,
    an output interface for outputting the audio signal to a downstream amplifier unit for amplifying the audio signal,
    a delay module designed to transmit the audio signal, delayed by a delay value, to the downstream amplifier unit and to reduce the delay value from a starting value to a final value during an adaptation phase, and
    a switch-on module for activating the downstream amplifier unit and for activating the delay module in response to the audio signal when the downstream amplifier unit is in an energy saving mode.

11. The control device according to claim 10, wherein the delay module transmits the audio signal to the downstream amplifier unit, and automatically and/or autonomously reduces the delay value during the adaptation phase.

12. The amplifier according to claim 1, wherein the delay module transmits the audio signal to the amplifier unit, and automatically and/or autonomously reduces the delay value during the adaptation phase.

13. The method according to claim 9, wherein reducing the delay value from a starting value to a smaller value and eventually to zero includes reducing the delay value continuously during the adaptation phase, the adaptation phase occurring for between 5 seconds and 10 seconds.

* * * * *